United States Patent
Singer (10) Patent No.: US 6,658,084 B2
(45) Date of Patent: Dec. 2, 2003

(54) ILLUMINATION SYSTEM WITH VARIABLE ADJUSTMENT OF THE ILLUMINATION

(75) Inventor: Wolfgang Singer, Aalen (DE)

(73) Assignee: Carl Zeiss SMT AG (DE)

( * ) Notice: Subject to any disclaimer, the term of this patent is extended or adjusted under 35 U.S.C. 154(b) by 0 days.

(21) Appl. No.: 10/042,122

(22) Filed: Oct. 25, 2001

(65) Prior Publication Data
US 2002/0136351 A1 Sep. 26, 2002

(30) Foreign Application Priority Data
Oct. 27, 2000 (DE) .......................... 100 53 587

(51) Int. Cl.[7] ................................. G21K 5/00
(52) U.S. Cl. .......................... 378/34; 378/145
(58) Field of Search ................. 378/34, 85, 145, 378/146, 147, 35, 84

(56) References Cited

U.S. PATENT DOCUMENTS

| | | | |
|---|---|---|---|
| 5,339,346 A | 8/1994 | White | 378/34 |
| 5,361,292 A | 11/1994 | Sweatt | 378/34 |
| 5,581,605 A | 12/1996 | Murakami et al. | 378/84 |
| 5,737,137 A | 4/1998 | Cohen et al. | 359/859 |
| 6,198,793 B1 * | 3/2001 | Schultz et al. | 378/34 |
| 6,400,794 B1 * | 6/2002 | Schultz et al. | 378/34 |
| 6,438,199 B1 * | 8/2002 | Schultz et al. | 378/34 |

FOREIGN PATENT DOCUMENTS

| | | |
|---|---|---|
| DE | 19903807 A1 | 11/1999 |
| EP | 0939341 A2 | 9/1999 |
| WO | WO99/57732 | 11/1999 |

\* cited by examiner

*Primary Examiner*—David V. Bruce
*Assistant Examiner*—Courtney Thomas
(74) *Attorney, Agent, or Firm*—Ohlandt, Greeley, Ruggiero & Perle, LLP

(57) ABSTRACT

An illumination system comprises (a) a first optical element upon which a light beam impinges, where the first optical element has first raster elements that partition said light beam into light channels; (b) a second optical element that receives said light channels, where the second optical element has a second raster elements; (c) an object plane that receives said light channels via said second optical element; and (d) an exit pupil that is provided with an illumination via said object plane. The system is characterized by an assignment of a member of said first raster elements and a member of said second raster elements to each of said light channels to provide a continuous beam path from said first optical element to said object plane for each of said plurality of light channels. The assignment is changeable to provide an adjustment of said illumination in said exit pupil.

52 Claims, 8 Drawing Sheets

ILLUMINATION SYSTEM WITH VARIABLE ADJUSTMENT OF THE ILLUMINATION

BACKGROUND OF THE INVENTION

1. Field of the Invention

The invention concerns an illumination system for wavelengths ≦193 nm, particularly for EUV lithography, a method for adjusting the illumination in an exit pupil of an illumination system, as well as a projection exposure comprising such an illumination system.

2. Description of the Prior Art

In order to allow even further reduction in the line widths for electronic components, particularly in the submicron range, it is necessary to reduce the wavelength of the light used for the microlithography. For example, with wavelengths less than 193 nm, lithography with soft X-rays, so-called EUV lithography is possible.

An illumination system suitable for EUV lithography should illuminate homogeneously, i.e., uniformly, the field used in EUV lithography, particularly the ring field of an objective, with as few reflections as possible, and furthermore, the pupil of the objective should be illuminated up to a particular filling ratio a, independently of the field, and the exit pupil of the illumination system should lie in the entrance pupil of the objective.

From U.S. Pat. No. 5,339,346 an illumination system for a lithography device that uses EUV radiation has been made known. For uniform illumination in the plane of the reticle and filling of the pupils, U.S. Pat. No. 5,339,346 proposes a condenser, which is constructed as a collector lens and comprises at least four mirror facets arranged in pairs and symmetrically. The light source used is a plasma light source.

In U.S. Pat. No. 5,737,137 there is shown an illumination system with a plasma light source comprising a condenser mirror. In U.S. Pat. No. 5,737,137 an illumination of a mask or reticle is achieved by means of spherical mirrors.

U.S. Pat. No. 5,361,292 shows an illumination system in which a plasma light source is used. The point-like plasma light source is imaged into a ring-shaped illuminated surface by means of a condenser having five aspheric mirrors arranged eccentrically. The ring-shaped illuminated surface is then imaged in the entrance pupil by means of a special sequence of grazing-incidence mirrors.

From U.S. Pat. No. 5,581,605 an illumination system in which a photon emitter is divided into a plurality of secondary light sources by means of a honeycomb condenser is known. In this way, a uniform illumination is achieved in the plane of the reticle. The imaging of the reticle on the wafer to be exposed is done with conventional reduction optics. Exactly one rastered mirror with elements of equal curvature is arranged in the illumination beam path.

EP 0 939, 341 shows a Köhler illumination system for wavelengths <200 nm, especially for the EUV range, with a first optical integrator comprising a plurality of first raster elements and a second optical integrator, comprising a plurality of second raster elements. The light distribution in the exit pupil is controlled by a diaphragm wheel, which involves a considerable loss of light. As an alternative to this, for a quadrupole distribution of light, it is proposed to split the light beam after the source and before the first optical integrator into four light beams. Various other illumination settings can also be achieved according to EP 0 939,341 without the use of diaphragms, for example, by changing optics. This type of variation of the illumination settings is on the one hand very costly, and on the other hand limited to certain types of illumination settings, namely, annular and quadrupolar illumination.

From DE 199 03,807 A1 there is another known EUV illumination system. The system according to DE 199 03 807 comprises two mirrors or lenses with raster elements. Such systems are also known as double-faceted EUV illumination systems. The disclosure content of DE 199 03,807 A1 is fully incorporated into the present application.

In DE 199 03,807 A1, the basic construction principle of a double-faceted EUV illumination system is illustrated. The illumination in the exit pupil of the illumination system is determined, according to DE 199 03,807, by the arrangement of the raster elements on the second mirror. A variable controlling of the illumination in the exit pupil or the adjustment of a predetermined distribution of the illumination in the exit pupil is not described by simple means according to DE 199 03,807.

SUMMARY OF THE INVENTION

The object of the invention is to indicate the most simple possible construction of a double-faceted illumination system, which allows a variable adjustment of any illumination distribution in the exit pupil with substantially no losses of light, as well as a method for adjusting an illumination distribution in such an illumination system.

According to the invention, the object is solved in that, in an illumination system for wavelengths ≦193 nm, particularly for EUV lithography, a predetermined illumination in an exit pupil is adjusted by altering points of incidence of light channels traveling from a light source to the exit pupil. Thanks to such an adjustment of the light distribution in the exit pupil, any given distributions can be realized and losses of light, such as occur for example in the solutions using diaphragms, can be avoided.

While the system is designed to be purely reflective at wavelengths in the EUV range, i.e., designed exclusively with mirror components, refractive components such as lenses or lens arrays are used as so-called optical integrators in 193-nm or 157-nm systems.

Thus, the invention also provides an illumination system in the 193-nm and 157-nm range, with which the illumination of the exit pupil can be adjusted and changed in a simple manner.

With the illumination system of the invention, the field in the plane of the reticle is illuminated homogeneously and with a partially filled aperture. Furthermore, the exit pupil of the illumination system is illuminated variably.

As described below, several light distributions in the exit pupil can be obtained with the help of the invention.

For circular illumination, the distribution of light or the illumination setting in the exit pupil, which in the present case coincides with the objective pupil, is defined by the filling factor σ:

$$\text{Filling factor: } \sigma = r_{illumination}/R_{objective\ aperture}$$

Here, $r_{illumination}$ means the radius of the illumination and $R_{objective\ aperture}$ is the radius of the objective aperture.

By definition, for σ=1.0, the objective pupil is completely filled; and, for example, σ=0.6 corresponds to less than complete filling.

For an annular distribution of light, the objective pupil is illuminated in annular fashion. To describe this, one can use the following definition of $\sigma_{out}/\sigma_{in}$:

$$\sigma_{out} = \frac{r(90)}{R(NA_{max})} \text{ whereby } \int_0^{r(90)} I(r)rdr = 0.9 \cdot \int_0^{R(NA_{max})} I(r)rdr$$

$$\sigma_{in} = \frac{r(10)}{R(NA_{max})} \text{ whereby } \int_0^{r(10)} I(r)rdr = 0.1 \cdot \int_0^{R(NA_{max})} I(r)rdr$$

Another light distribution is the so-called quadrupole illumination for imaging of "Manhattan structures", for example.

According to the invention, all of the above-described settings can be realized at the same time in double-faceted illumination systems. In a first embodiment of the invention, on the second optical element with raster elements, hereinafter also called pupil raster elements or pupil honeycombs, the distribution of the second raster elements on the second optical element for all possible illuminations in the exit pupil are available.

By replacing the first optical element or lens with raster elements, hereinafter also called field raster elements or field honeycombs, or by changing the tilt of the raster element on the plate of the first optical element, then only the pupil raster elements of a particular setting, such as the quadrupole setting, can be illuminated on the second optical element. To achieve this the pupil raster elements are adapted to the illumination of the field raster elements. The illumination of the field raster elements depends on the light source. Between field raster elements and pupil raster elements by a tilt angle of raster elements or prismatic effect of the raster elements, there occurs a sorting of the input light distribution on the field raster elements into the output light distribution on the pupil raster elements and thus in the entrance pupil of the lithography objective.

In an alternative embodiment of the invention, the arrangement of the pupil raster elements on the second raster element does not provide for all possible illumination settings. The illumination is then adjusted, for example, by replacing both the first and the second optical element. The replacement accomplishes an adjustment of the point of incidence of the light channels in the exit pupil, which are determined by assigning the raster elements of the first optical element to raster elements of the second optical element, and thus the light distribution in the exit pupil is adjusted.

Of course, in an alternative embodiment, the illumination in the exit pupil can be achieved by moving and/or tilting the raster elements of the second optical element and the tilting the raster elements of the first optical element.

Hereinafter, the preferred embodiments of the invention shall be described with exemplary mirror systems, without this entailing a restriction to reflective systems. In reflective systems, the first and second optical elements with raster elements are faceted mirrors. The person skilled in the art will be able to transfer the steps given as examples to refractive systems without inventive activity, and without this being explicitly mentioned.

In the systems according to the invention with two optical elements with raster elements, the form of the pupil raster elements is adapted to the form of the secondary light sources and thus it differs from the form of the first field raster elements. The pupil raster elements are preferably especially elliptical or round, when the light source is also round in shape.

In a preferred embodiment of the invention, the field and pupil raster elements have a prismatic effect, i.e., they deflect the main beam through each individual raster element according to a predetermined angle.

The field raster elements can additionally have either an isotropic optical effect and the same aspect ratio as the field being illuminated, or an anisotropic effect with a smaller aspect ratio than the field being illuminated.

In order that each light bundle of each field raster element overlaps in the field plane, e.g., the reticle plane, in an advantageous embodiment of the invention, the pupil raster elements are inclined or tilted in relation to the pupil raster element plate, which supports the plurality of pupil raster elements.

If the system is constructed as a system with real intermediate images of the light source in the light path after the field raster element plate, the pupil raster elements can serve at the same time as field lenses for the coupled imaging of the light source in the entrance pupil of the lithography objective.

A light bundle that travels from a field raster element of the first mirror, i.e., a field honeycomb, to a pupil raster element of the second mirror, i.e., a pupil honeycomb, is designated as a light channel in the present application. The number N of light channels is determined by the number of field raster elements being illuminated.

In the first configuration of the invention, the number of pupil raster elements M of the pupil raster element plate is always greater than N, since the pupil raster elements for all adjustable illumination settings in the exit pupil are arranged on the pupil raster element plate. Therefore the pupil raster element plate supports more pupil raster elements than would be necessary from the number of channels, which are determined by the number of field raster elements on the field raster element plate. This, in turn, means that there are more pupil raster elements arranged on the pupil raster element plate than channels and only some of the pupil raster elements are illuminated at a setting with a particular number of field raster elements having N channels. This leads to a segmented or parcelled illumination of the pupil. A necessary requirement for this is that the etendue of the light source is smaller than the etendue of the lithography objective. If this is not the case there is no segmented illumination of the exit pupil. Therefore, it would no longer be possible to accommodate more raster elements than channels on the pupil raster element plate in the pupil plane and there would be a loss of light and light scattering by crosstalk among the channels. At present, the etendue of EUV sources, such as synchrotron or plasma sources, are less than that of the lithography objective.

In another advantageous embodiment, the second optical element with mirror facets is slightly shifted from the plane of secondary light sources, which are formed in the path after the first optical element with mirror facets, in the direction the light is traveling through the illumination system from the light source towards the object plane. Alternatively, the second optical element with mirror facets could be slightly shifted opposite the direction the light is traveling through the illumination system. This achieves a uniform illumination on the mirror facets of the second optical element and, thus, there is a smaller local thermal load. The amount of defocusing is such that the extent of the secondary light sources is smaller than the size of the pupil raster elements, while the width of the non-illuminated edge region is less than 10% of the minimum diameter of the pupil raster elements. A non-illuminated region will occur when the intensity in this region is <10% of the maximum intensity of the secondary light source.

In a preferred embodiment, additional optical elements such as field mirrors are arranged after the mirrors with raster elements and serve to image the pupil plane into the exit pupil of the illumination system, which coincides with the entrance pupil of the projection objective, and to form the ring field in the object plane.

It is especially preferred that the optical elements include grazing-incidence mirrors with an angle of incidence $\leq 15°$. In order to minimize the losses of light associated with each reflection, it is advantageous for the number of field mirrors to be kept small. Embodiments with no more than three field mirrors are especially preferred.

Possible light sources for the EUV radiation are laser plasma, plasma or pinch plasma sources, as well as other EUV light sources. Other EUV light sources are, for example, synchrotron radiation sources. Synchrotron radiation is emitted when relativistic electrons are deflected in a magnetic field. The synchrotron radiation is emitted tangentially to the path of the electrons.

BRIEF DESCRIPTION OF THE DRAWINGS

The invention will now be described by means of the drawings.

FIG. 6b.1: Top view onto a pupil raster element plate according to the invention with 200 pupil raster elements for circular illumination.

FIG. 6b.2: Top view onto a pupil raster element plate according to the invention with 200 pupil raster elements for ring-shaped illumination.

FIG. 6b.3: Top view onto a pupil raster element plate according to the invention with 200 pupil raster elements for quadrupolar illumination.

DESCRIPTION OF THE INVENTION

Figure 1:
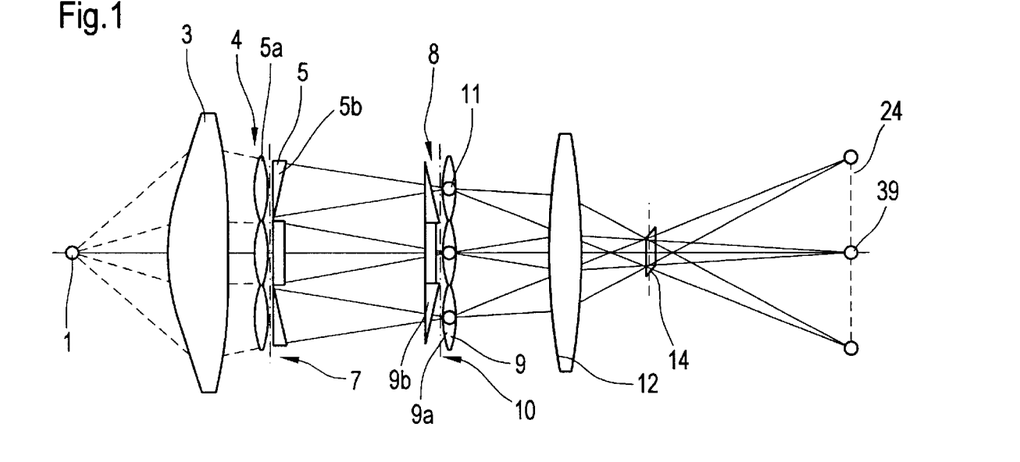
FIG. 1: Schematic diagram of the beam path of a system with two optical elements with raster elements.

FIG. 1 shows a schematic diagram of the beam path of a system with two faceted optical elements in refractive representation. The light of a light source 1 is collected by means of a collector lens 3 and converted into a parallel or convergent light bundle. A first optical element 4 includes field raster elements 5 that are arranged on a first raster element plate 7. The field raster elements 5 divide the light bundle impinging on the first optical element 4 into a plurality of light bundles and create secondary light sources 11 in a plane, where pupil raster elements 9 of a second optical element 8 are arranged. The pupil raster elements 9 are arranged on a pupil raster element plate 10. A field lens 12 images the secondary light sources 11 in an exit pupil 24 of the illumination system or an entrance pupil of a following objective (not shown). The entrance pupil of the objective coincides with the exit pupil 24 of the illumination system. The term "Köhler illumination" is also frequently used for this illumination technique, as for example in the Lexikon der Optik, Leipzig, 1990, p. 183.

Field raster elements 5, like pupil raster elements 9, have positive optical power, i.e., are collective in the embodiment shown, and furthermore, have a prismatic effect. The collective and prismatic properties are shown separately in FIG. 1. The prismatic effect of the field raster element 5 is schematically depicted as a prism and denoted with reference 5B. The collective effect of the field raster element 5 is schematically depicted as a lens and denoted with reference 5A. The prismatic effect of the pupil raster element 9 is schematically depicted as a prism and denoted with reference 9B. The collective effect of the pupil raster element 9 is schematically depicted as a lens and denoted with reference 9A.

The illumination system according to FIG. 1 will now be considered section by section. Since the intersection is the light and aperture distribution in the plane of the field raster elements, the discussion can be independent of the type of source and the collector mirror.

Figure 2A:
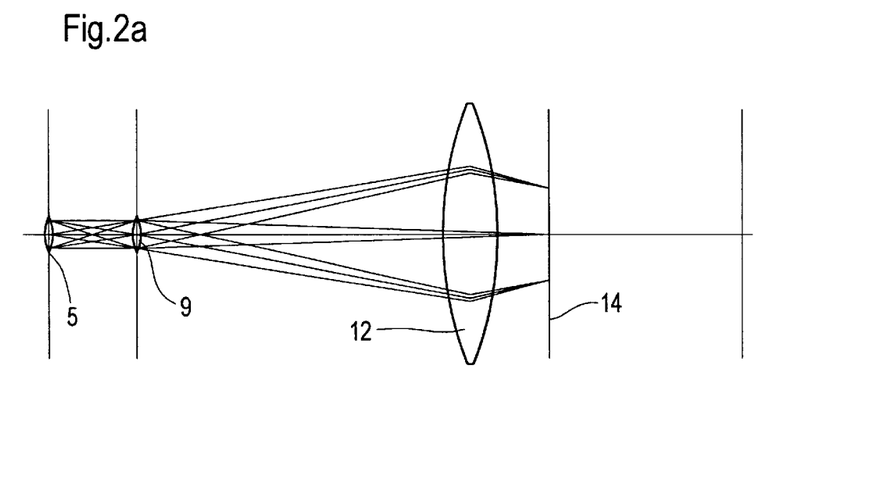
FIGS. 2a and 2b: Field imaging and pupil imaging for the central pair of field and pupil raster elements.
Figure 2B:
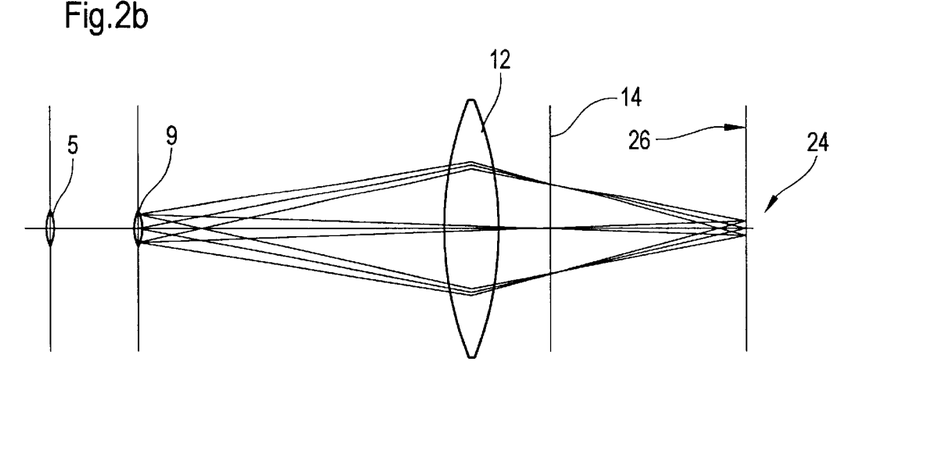
Figure 3:
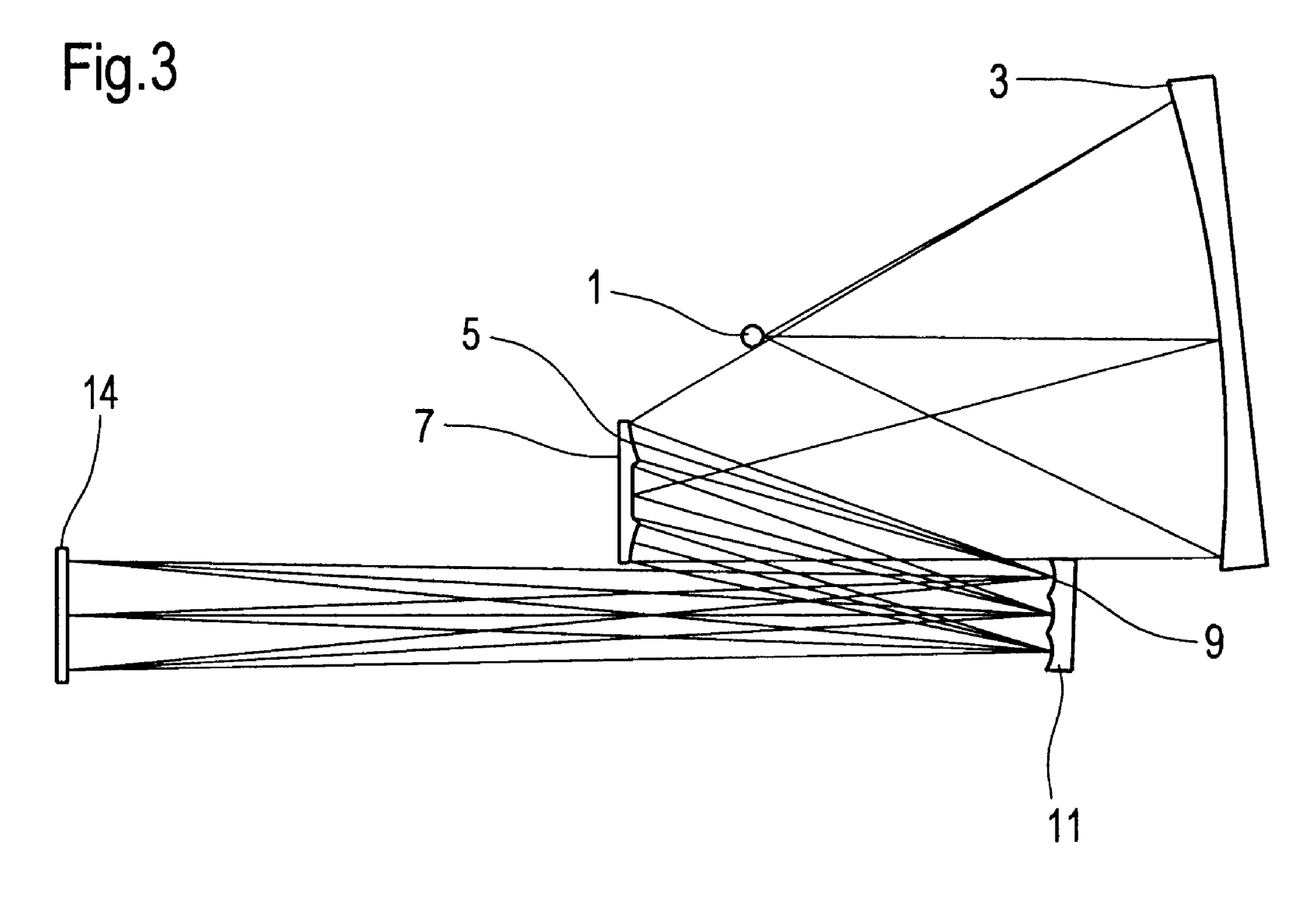
FIG. 3: Schematic diagram of the beam path of a system with two mirrors with raster elements and collector unit.
Figure 5A:
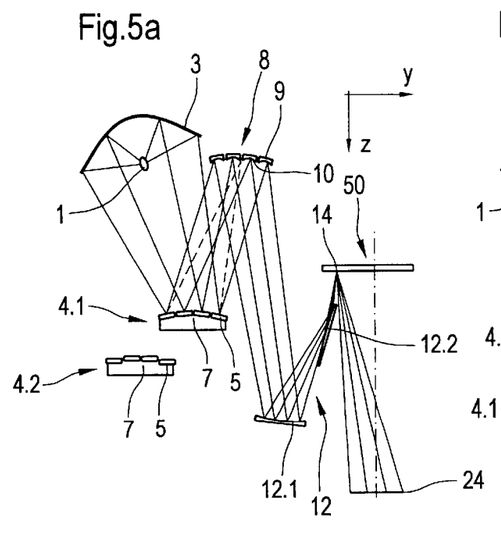
FIGS. 5a–5b: Beam path in a reflective system with two mirrors with raster elements with a first and a second arrangement of the raster elements on the first mirror.
Figure 5B:
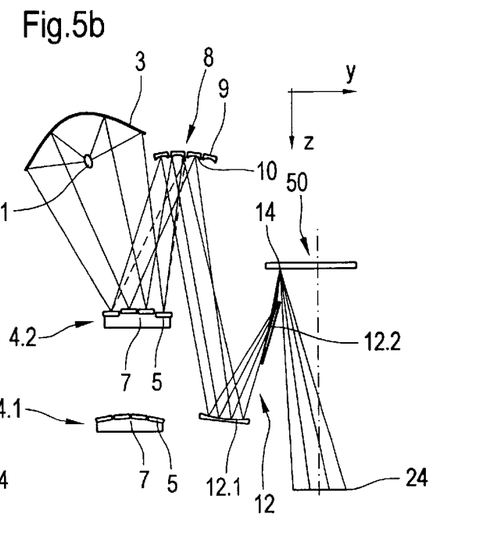

In FIGS. 2A and 2B, the field and pupil imaging is shown for the central pair of field raster elements 5 and pupil raster elements 9. By means of the pupil raster elements 9 and the field lens 12, field raster element 5 is imaged on a reticle plane 14 or a mask being imaged. The geometrical extension of field raster element 5 determines the shape of an illuminated field in reticle plane 14. If there are field raster elements 5 with an isotropic optical effect and if the form of field raster elements 5 is chosen to be rectangular, the aspect ratio of field raster elements 5 corresponds to the ratio of arc length to ring width of the required ring field in the object or reticle plane 14. The ring field, as shown in FIGS. 5a–5b, is formed by the field lens. Without a field lens, as shown in FIG. 3, there results a rectangular field in reticle plane 14.

The imaging scale or reduction ratio is given approximately by the ratio of the distance from pupil raster elements 9 to reticle plane 14 and from field raster elements 5 to pupil raster elements 9. The optical effect of field raster elements 5 is designed so that an image of light source 1 arises at or near the site of pupil raster elements 9, i.e., secondary light sources 11. That is, field raster elements 5 produce a plurality of secondary light sources in or near pupil raster elements 9, preferably within a distance of less than $\frac{1}{10}$ the distance between first optical element 4 and second optical element 8.

As shown in FIG. 2B, the function of the field lens 12 is to image the secondary light sources 11 into the exit pupil 24 of the illumination system 26, which in the present case coincides with the entrance pupil of the objective. If a field lens 12 is placed in the beam path, the field imaging will be influenced by the field lens 12 and a ring field is formed by the distortion of the field lens 12. The reduction ratio of the field raster elements 5 imaging will not be altered by the field lens 12.

Assuming that secondary light sources 11 are in a plane, field lens 12 serves as a third optical element that images the plane in exit pupil 24. Such a plane is situated in or near second optical element 8, and preferably within a distance of $\frac{1}{10}$ the distance between first optical element 4 and second optical element 8.

For an illumination system in the EUV wavelength region, all components must be configured for reflection.

Due to high reflection losses at λ=10 nm–14 nm, it is advantageous to keep the number of reflections as small as possible.

When constructing a reflective system, vignetting of beams must be taken into account. This can be done by constructing the system in a zigzag beam path or by working with obscurations.

To form the ring field in reticle plane 14, a grazing incidence field mirror can be used in reflective systems.

FIG. 3 shows an embodiment of the invention in which a plasma light source is used as light source 1. The system is a purely reflective design and is depicted without a field mirror.

The illumination system in the present embodiment example contains, as the light source 1, a pinch plasma source; as the EUV collector, a collector mirror 3 that collects the light and reflects it onto field raster element plate 7; a pupil raster element plate 10, and a reticle in a reticle plane 14. By reflection at the field raster elements 5, the light is guided to the individual pupil raster elements 9 of the pupil raster element plate 11 and from there it is guided into reticle plane 14. The pinch plasma source is an extensive light source (roughly 1 mm) with a directional radiation in a relatively small range of solid angles of approximately Ω=0.3 sr. The exit pupil of the illumination system is not shown in FIG. 3.

Figure 4A:
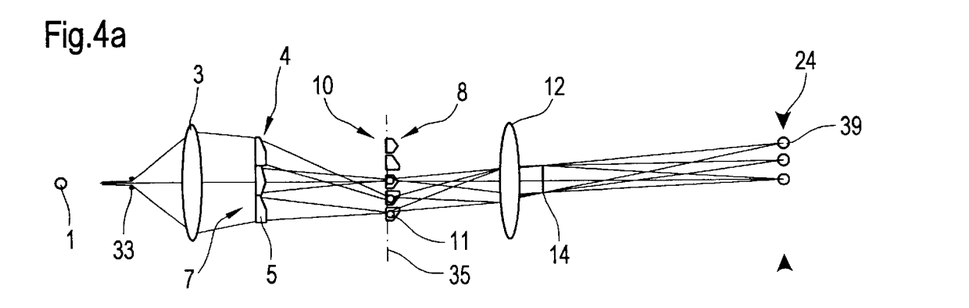
FIGS. 4a–4b: Beam path in a refractive system with two lenses with raster elements with a first and a second arrangement of the raster elements on the first lens, leading to two different illuminations.
Figure 4B:
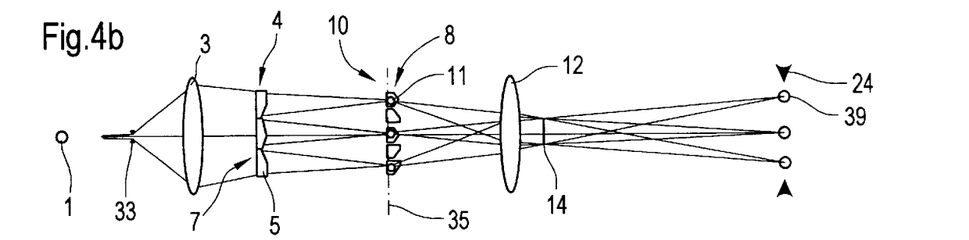

A system according to the invention in refractive mode is shown in FIGS. 4a and 4b.

The same components as in the figures before have the same reference numbers. The light source in the present case is a strongly directional light source, without being limited to this. Such a light source in the EUV range is a synchrotron light source. In order to expand the strongly directional radiation with a divergence less than 10 mrad, for example, the system has a diverger or divergent element 33.

Regarding the configuration of double-faceted illumination systems with a synchrotron radiation source, reference is made to WO 99/57732, the disclosure of which is incorporated in its entirety in the present application. For other light sources, such as laser plasma sources, such beam broadening is not necessary.

The beam emerging from the light source is guided by the collector lens 3 onto the first lens array 4 with raster elements. In the refractive embodiment shown, a first lens array, e.g., first optical element 4, comprises a raster element plate 7, on which a plurality of field raster elements 5 are arranged. The individual field raster elements 5 have a prismatic effect and thus form in a plane 35 a number of secondary light sources 11. In plane 35 there is arranged a second lens array, e.g., second optical element 8, with raster elements. This second optical element 8 also comprises a raster element plate 10. The raster elements arranged on raster element plate 10 are pupil raster elements 9. The prismatic effect of raster elements 5 of first optical element 4 is chosen such that each of secondary light sources 11 coincides with a particular pupil raster element 9 on second optical element 8. Thanks to such an arrangement, each field raster element 5 is coordinated with a pupil raster element 9 of a particular setting. A light bundle that passes through a field raster element 5 and a particular pupil raster element 9 in a refractive embodiment of the invention is termed a light channel in the present application. The number of possible channels N is given by the number of illuminated field raster elements 5 on field raster element plate 7. Since, in the depicted embodiment, for all adjustable illuminations in exit pupil 24 the pupil raster elements are arranged on the same pupil raster element plate 10, the number of pupil raster elements 9 on pupil raster element plate 10 is always greater than the number of channels. The illumination of only certain pupil raster elements 9 on pupil raster element plate 10 leads to a segmented or parcelled illumination in exit pupil 24.

The light, which passes through the selected pupil raster elements 9, is shaped by means of field lens 12, situated near the object or reticle plane 14. In reticle plane 14, the images of field raster elements 5 are superimposed. Images 39 of secondary light sources 11 fill the exit pupil 24 of the illumination system, which coincides with the entrance pupil of the objective (not shown), in a segmented manner.

The segmenting of the images of secondary light sources 11 in exit pupil 24 is a direct image of illuminated pupil raster elements 9 in the plane 35 and, thus, of the selection of the same by field raster elements 5.

Now, if field raster element plate 7 of FIG. 4a is replaced by the field raster element plate shown in FIG. 4b, on which field raster elements with a different prismatic effect are arranged, then the field raster elements on field raster element plate 7 of FIG. 4b, illuminate different pupil raster elements 9 on pupil raster element plate 10 than that of FIG. 4a. Consequently, the images of the secondary light sources 39 in FIG. 4b have a different position in exit pupil 24 than the images of the secondary light sources according to FIG. 4a.

FIGS. 5a and 5b show reflective embodiments of the invention. The same reference numbers are used for the effect of the same components as in the refractive embodiment depicted in FIGS. 4a and 4b. In place of a lens array for the first and second optical elements 4, 8 with raster elements 5, 9, in the reflective embodiment example these are mirrors with raster elements 5, 9. The raster elements or facets 5, 9 are arranged on raster element plates 7, 10 with a particular orientation, e.g., position and angle of tilt. If one changes the orientation, e.g., angle of tilt, of individual field raster elements 5 on field raster element plate 7 and thereby the prismatic effect of field raster elements 5, it is possible to alter the assignment of field raster elements 5 with pupil raster elements 9 on the pupil raster element plate 10 and thus, as in the refractive system shown in FIGS. 4a and 4b, to change the illumination in exit pupil 24.

The first mirrors with raster elements having field raster elements 5 with different orientations, e.g., tilt angles, arranged on raster element plate 7 are designated with 4.1 and 4.2. A changing of the tilt angle of the field raster elements 5 could be accomplished by actuators directly on the field raster element plate or by replacing mirror 4.1 with mirror 4.2, which differ by the field raster elements arranged under different tilt angles on the field raster element plate of the mirror. Instead of a field lens 12, the reflective system comprises a normal-incidence field mirror 12.1 and a grazing-incidence field mirror 12.2 as the field-imaging and field-shaping group.

In a scanning EUV system, the reticle is arranged on a reticle carrier 50 and can move in the y-direction.

FIGS. 4a–4b and 5a–5b show how it is possible to influence the illumination in exit pupil 24 of the illumination system by simply replacing the field raster element plate 7 and selecting the illuminated pupil raster elements 9 on pupil raster element plate 10.

In reflective systems, field raster elements 5 can be mirror elements with collecting effect. As an alternative to this, the collecting effect can be transferred entirely to the collector mirror and the field raster elements can be configured as planar facets.

If the field raster elements of the field raster element plates of different mirrors with raster elements have different prismatic effect, then as shown in FIGS. 5a–5b, different illuminations in exit pupil 24 can be realized by replacing one mirror with raster elements by another mirror with raster elements. As an alternative to this, the prismatic effect of respective field raster elements of a mirror can be achieved by changing the tilt angle, for example, with actuators of the respective field raster elements on the field raster element plate of the mirror with raster elements.

In order to superimpose the light bundles of the different field raster elements in the field plane, which coincides with reticle plane 14, the pupil raster elements also have an prismatic effect, or, in the case of reflective systems, the pupil raster elements have a tilt angle with regard to the pupil raster element plate.

Field raster elements 5 can either have an isotropic optical effect and then have the same aspect ratio as the field being illuminated in field plane 14, or they can be of anisotropic effect. In this case, the aspect ratio of the field raster elements is different from the aspect ratio of the field. As a rule, the aspect ratio of the field raster elements is smaller than the aspect ratio of the field.

Figure 6A:
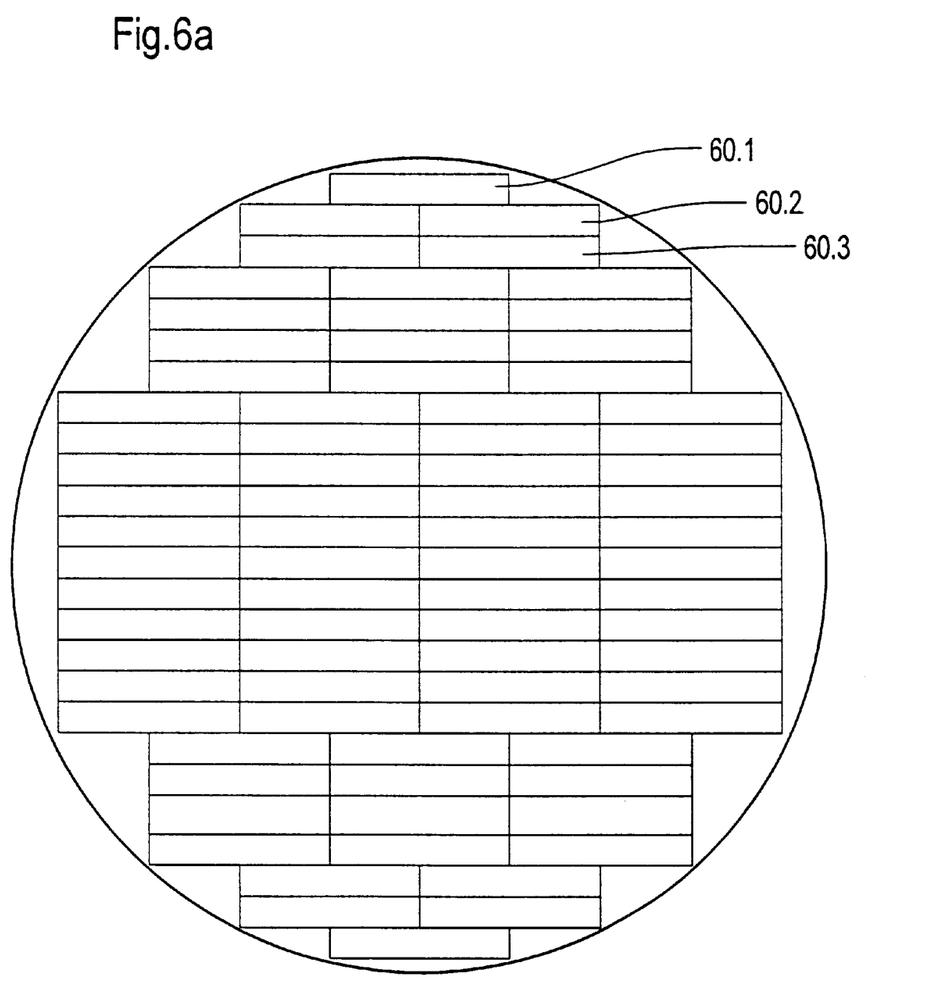
FIG. 6a: Top view onto a field raster element plate with 72 field raster elements.

FIG. 6a shows a top view onto an example of a field raster element plate 7 with a total of 72 raster elements, which are arranged in rows 60.1, 60.2 . . . , and are shifted, or offset, relative to one another.

Figure 6B:
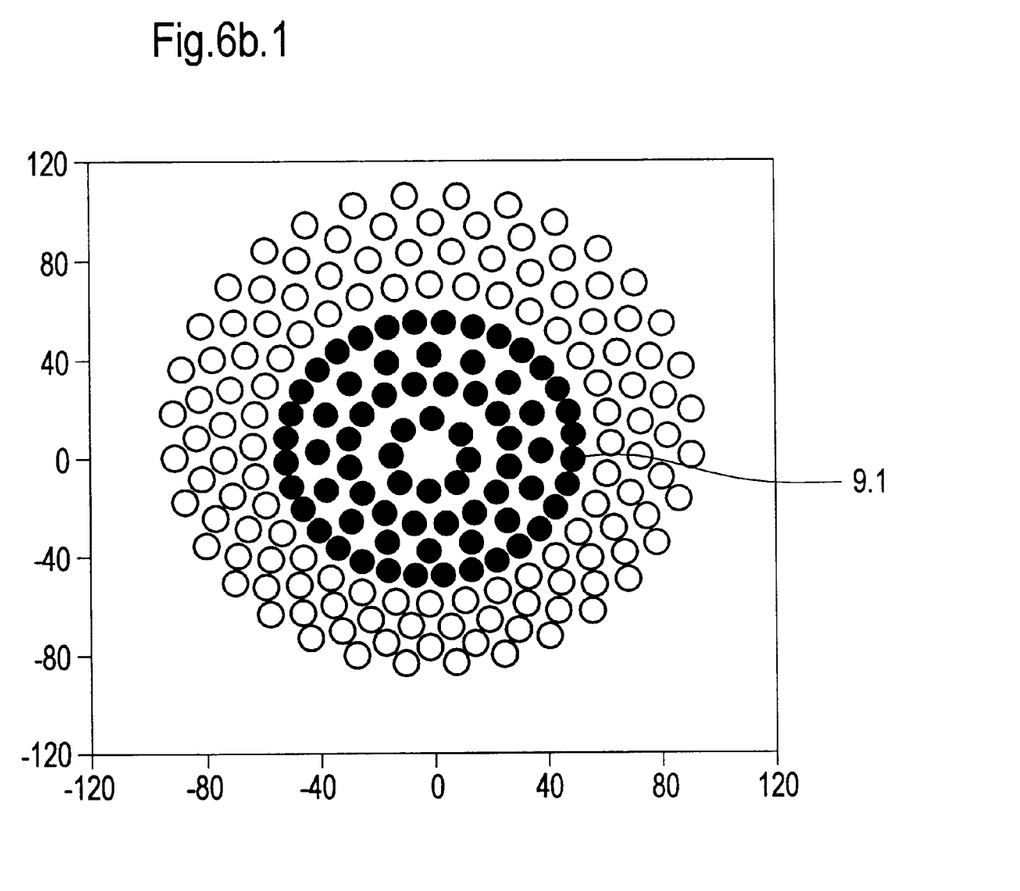
Figure 6B:
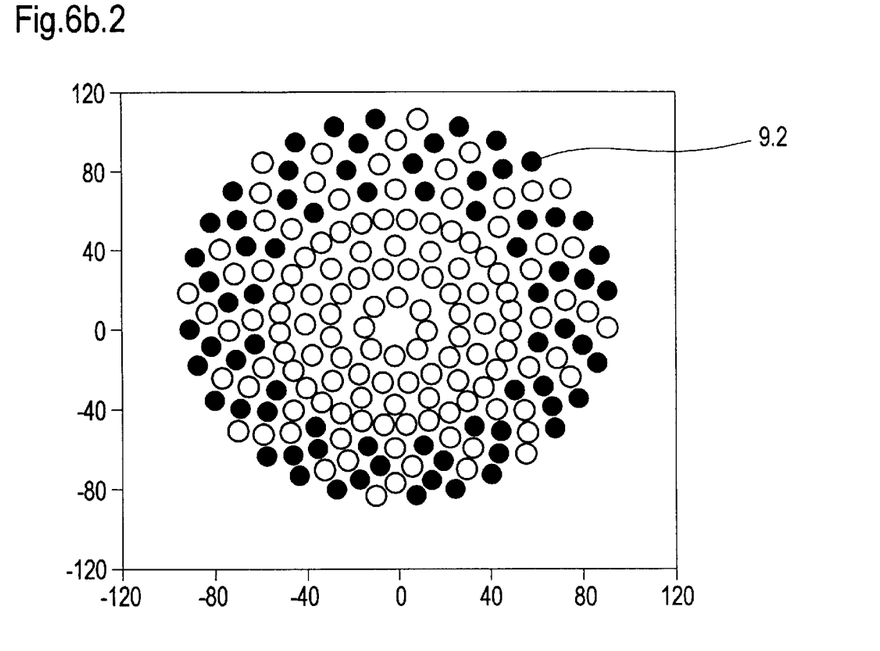
Figure 6B:
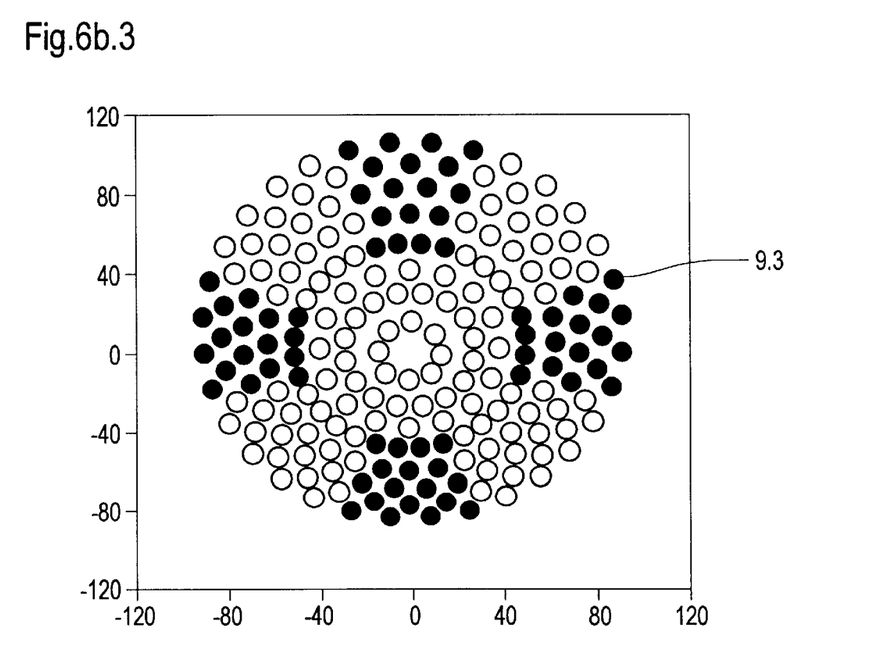

FIGS. 6b.1–6b.3 show a top view onto a pupil raster element plate, wherein the 72 channels of the field raster element plate are available for each of the different illumination settings, namely, circular setting, ring-shaped or annular setting, and quadrupole setting. For a conventional illumination, all 72 channels must be uniformly distributed over all field raster elements. Ideally, the pupil raster elements are all the same size or at least big enough so that they are not completely illuminated by an image of the secondary light sources.

FIG. 6b.1 shows the pupil raster elements 9.1 that are illuminated in a circular setting, being depicted dark. FIG. 6b.2 shows the pupil raster elements 9.2 in dark that are illuminated for the annular setting, and FIG. 6b.3 shows the pupil raster elements 9.3 in dark that are illuminated in the quadrupole setting.

In FIG. 6b1–6b3 the second optical component carries all necessary pupil facets for three illuminations. In another embodiment instead of a second optical element carrying all necessary pupil facets for three illuminations, one could use three different second optical elements, each second optical element carrying only the facets for one illumination. Nevertheless, to adjust the light channel for the different illumination settings, the plate carrying the field raster element s, or the angle of inclination of the field raster elements on the plate, will also be changed.

Figure 7:
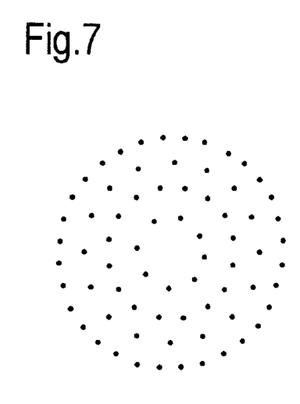
FIG. 7: Circular illumination of the exit pupil of a system according to the invention.
Figure 8:
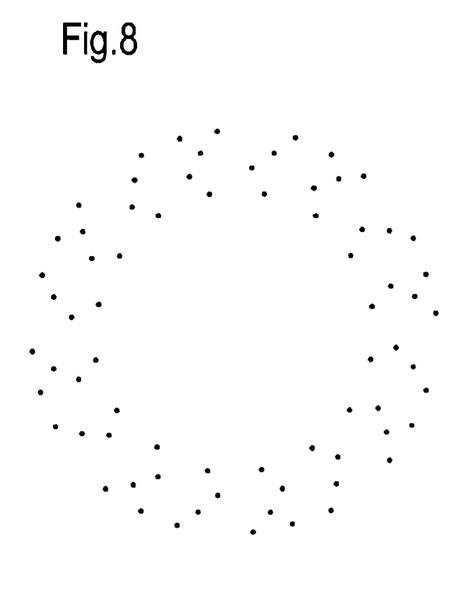
FIG. 8: Ring-shaped illumination of the exit pupil of a system according to the invention.
Figure 9:
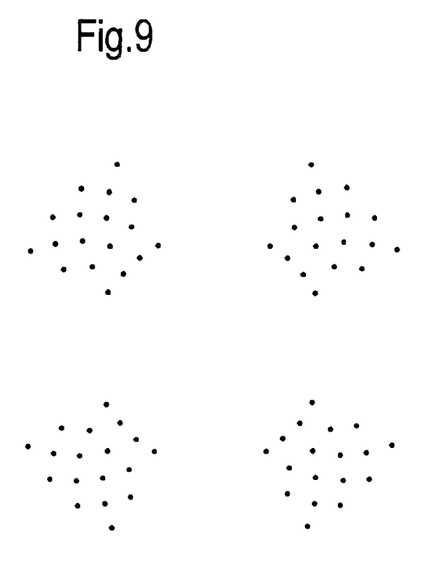
FIG. 9: Quadrupole illumination of the system according to the invention.

FIGS. 7–9 show the distribution of the images of secondary light sources 39 for the different illuminations in the exit pupil.

FIG. 7 shows a circular setting with σ=0.4 in the case of circular illumination of the pupil raster element plate.

FIG. 8 shows an annular setting with $\sigma_{out}/\sigma_{in}=0.8/0.4$ for ring-shaped illumination of the pupil raster element plate.

In the illumination system of the present invention, the light channels can be configured such that a number of segments of the illumination are separated from each other in the exit pupil. Embodiments having an even number of segments are contemplated, although the invention is not limited as such. FIG. 9 shows a quadrupole setting with four ring-circle segments as illumination.

The different settings of the distribution of illumination in the exit pupil can be achieved, according to the invention, by replacing the field raster element plate or by changing the angle of inclination of the individual field raster elements on the field raster element plate.

Figure 10:
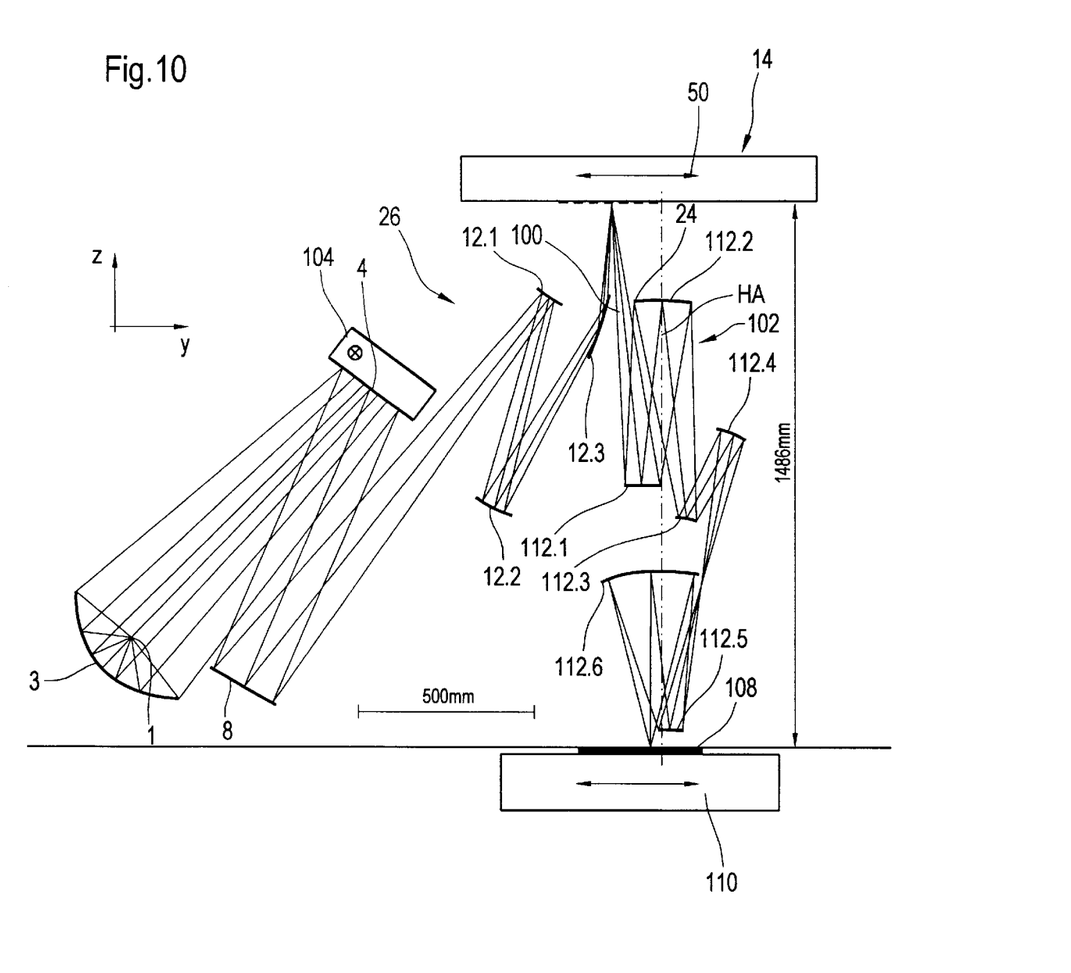
FIG. 10: Structure of an EUV projection system with an illumination system according to the invention.

FIG. 10 shows a complete EUV illumination system, in which a system according to the invention is shown for adjusting the illumination in an exit pupil 24 of an illumination system 26, which coincides with an entrance pupil 100 of an objective 102. The system comprises a light source 1, a collector mirror 3 for collecting the light of light source 1, a first optical element 4 with raster elements, a second optical element 8 with raster elements, and three field-forming mirrors 12.1, 12.2, 12.3, which are arranged after the second optical element 8 and which essentially serve to form a field in a reticle plane 14. A reticle in reticle plane 14 is a reflection mask in the present case. The reticle can move in the y-direction in the EUV system, designed as a scanning system.

The illumination system comprises a shifting device with a shifting table, on which a plurality of first optical elements is arranged, so that the first optical elements can be replaced by displacement of the shifting table. In order to accommodate various first optical elements for adjusting the setting in the beam path of the illumination system, several field raster element plates with different prismatic effect are arranged on another carrier system 104. The additional carrier system 104 is a plane parallel to the reticle plane, perpendicular to the y-direction, that is, it can move in the x-direction in the present example. In this way, different field raster element plates can be brought into the beam path and thus different light channels can be realized between the first optical element with raster elements and the second optical element with raster elements and, thus, different illuminations of the exit pupil of the illumination system, which coincides with the entrance pupil 100 of following objective 102.

The following projection objective 102 is a six-mirror projection objective, as shown, for example in U.S patent application Ser. No. 09/503,640, the disclosure content of which is incorporated in its entirety in the present application. An object 108 to be exposed, for example, a wafer for an electronic device, is likewise situated on a carrier system 110 that can be moved. Mirrors 112.1, 112.2, 112.3, 112.4, 112.5, 112.6 of the projection objective 102 are centered in respect to a common optical axis HA. A ring-shaped object field in reticle plane 14 is situated eccentrically. The light beam between the reticle and the first mirror 112.1 of the projection objective 102 is tilted towards the optical axis HA of the projection objective 102. Chief ray angles with respect to a normal line of the reticle are preferably between 5° and 7°.

As follows from FIG. 10, the illumination system is distinctly separated from the projection objective.

With the invention, for the first time a simple design of a device is specified for achieving different settings in the exit pupil of an illumination system.

It should be understood that various alternatives and modifications of the present invention can be devised by those skilled in the art. The present invention is intended to embrace all such alternatives, modifications and variances that fall within the scope of the appended claims.

Reference List
1: Light source
3: Collector lens
4: First optical element
4.1: First mirror with raster elements in a first arrangement
4.2: First mirror with raster elements in a second arrangement
5: Field raster elements
7: First raster element plate
8: Second optical element
9: Pupil raster elements
10: Second raster element plate
11: Secondary light sources
12: Field lens
12.1: Normal-incidence field mirror
12.2: Grazing-incidence field mirror
12.3: Normal-incidence field mirror
14: Reticle plane
24: Exit pupil of the illumination system
26: Illumination system
33: diverger or divergent element
35: Plane of the secondary light sources 11
39: Images of the secondary light sources
50: Reticle carrier
60.1, 60.2 . . . : Rows of the field raster element plate
100: Entrance pupil of the objective
102: Projection objective
104: Additional carrier system
108: Object being exposed
110: Carrier system for the object
112.1, 112.2,
112.3, 112.4
112.5, 112.6: mirrors of the projection objective
HA: Optical axis of the projection objective
X-direction: Direction of shifting of the carrier system of the different field raster element plates
Y-direction: Scanning direction of the reticle

What is claimed is:

1. An illumination system for wavelengths ≦193 nm, comprising:

a first optical element upon which a light beam from a light source impinges, said first optical element having a first plurality of raster elements that partition said light beam into a plurality of light channels; p1 a second optical element that receives said plurality of light channels, said second optical element having a second plurality of raster elements;

an object plane that receives said plurality of light channels via said second optical element; and an exit pupil that is provided with an illumination via said object plane, wherein said illumination system is characterized by an assignment of a member of said first plurality of raster elements and a member of said second plurality of raster elements to each of said plurality of light channels to provide a continuous beam path from said first optical element to said object plane for each of said plurality of light channels, and wherein said assignment is changeable to provide an adjustment of said illumination in said exit pupil.

2. The illumination system of claim 1, wherein said second plurality of raster elements is of a quantity such that said changeable assignment yields a plurality of adjustments of said illumination without having to replace said second optical element.

3. The illumination system of claim 2, wherein said first optical element one of a plurality of first optical elements, and wherein said assignment is changed by replacing said first optical element with another of said plurality of first optical elements.

4. The illumination system according to claim 3, wherein said illumination system further comprises a shifting table on which said plurality of first optical elements is arranged, and wherein said replacing is achieved by displacing said shifting table.

5. The illumination system of claim 1, wherein said second plurality of raster elements is of a quantity M, wherein said first plurality of raster elements is of a quantity N, and wherein M is greater than N.

6. The illumination system of claim 2, wherein said first plurality of raster elements comprise a plurality of mirror facets on a plate, and wherein said assignment is changed by tilting said plurality of mirror facets relative to a plane of said plate.

7. The illumination system of claim 1, wherein said first optical element is one of a plurality of first optical elements, and wherein said assignment is changed by replacing said first optical element with another of said plurality of first optical elements.

8. The illumination system of claim 7, wherein said second optical element is one of a plurality of second optical elements, and wherein said assignment is changed by also replacing said second optical element with another of said plurality of second optical elements.

9. The illumination system of claim 7, wherein said second plurality of raster elements comprise a plurality of mirror facets, and wherein said assignment is changed by also changing an orientation of said plurality of mirror facets.

10. The illumination system of claim 1, wherein said first plurality of raster elements comprise a plurality of mirror facets, and wherein said assignment is changed by changing an orientation of said plurality of mirror facets.

11. The illumination system of claim 10, wherein said second optical element is one of a plurality of second optical elements, and wherein said assignment is changed by also replacing said second optical element with another of said plurality of second optical elements.

12. The illumination system of claim 10, wherein said second plurality of raster elements comprise a plurality of mirror facets, and wherein said assignment is changed by also changing an orientation of said plurality of mirror facets.

13. The illumination system of claim 1, wherein said first plurality of raster elements are imaged in said object plane, and wherein said plurality of light channels are superimposed on each other in said object plane.

14. The illumination system of claim 1, wherein said light source is a primary light source, and wherein said first plurality of raster elements produce a plurality of secondary light sources in or near said second plurality of raster elements.

15. The illumination system of claim 1, further comprising a collector unit between said light source and said first optical element.

16. The illumination system of claim 1, further comprising a third optical element in said beam path after said second optical element,
   wherein said third optical element images a plane in said exit pupil, and
   wherein said plane is situated in or near said second optical element.

17. The illumination system of claim 1, further comprising a third optical element in said beam path after said second optical element, wherein said second plurality of raster elements and said third optical element image said first plurality of raster elements in said object plane.

18. The illumination system of claim 1, wherein said plurality of light channels is configured such that said illumination in said exit pupil is circular.

19. The illumination system of claim 1, wherein said plurality of light channels is configured such that said illumination in said exit pupil is ring-shaped.

20. The illumination system of claim 1, wherein said plurality of light channels is configured such that a number of segments of said illumination are separated from each other in the exit pupil.

21. The illumination system of claim 20, wherein said number of segments is an even number.

22. A method for adjusting a distribution of illumination in an exit pupil of an illumination system for wavelengths $\leq 193$ nm, comprising:
   using an illumination system, having:
      a first optical element upon which a light beam from a light source impinges, said first optical element having a first plurality of raster elements that partition said light beam into a plurality of light channels;
      a second optical element that receives said plurality of light channels, said second optical element having a second plurality of raster elements;
      an object plane that receives said plurality of light channels via said second optical element; and
      an exit pupil that is provided with an illumination via said object plane,
      wherein said illumination system is characterized by an assignment of a member of said first plurality of raster elements and a member of said second plurality of raster elements to each of said plurality of light channels to provide a continuous beam path from said first optical element to said object plane for each of said plurality of light channels, and
      wherein said assignment is changeable to provide an adjustment of said illumination in said exit pupil,
   wherein said exit pupil is characterized by a given light distribution that is adjusted by replacing said first and/or second optical element and/or by changing a prismatic effect and an arrangement of said first and/or second plurality of raster elements, by tilting and/or shifting the first and/or second plurality of raster elements, and
   wherein said assignment is changed to adjust said illumination in said exit pupil.

23. A projection exposure system for microlithography comprising:
   an illumination system having:
      a first optical element upon which a light beam from a light source impinges. said first optical element having a first plurality of raster elements that partition said light beam into a plurality of light channels;
      a second optical element that receives said plurality of light channels, said second optical element having a second plurality of raster elements;
      an object plane that receives said plurality of light channels via said second optical element; and
      an exit pupil that is provided with an illumination via said object plane,
      wherein said illumination system is characterized by an assignment of a member of said first plurality of raster elements and a member of said second plurality of raster elements to each of said plurality of light channels to provide a continuous beam path from said first optical element to said object plane for each of said plurality of light channels, and
      wherein said assignment is changeable to provide an adjustment of said illumination in said exit pupil,
      wherein said illumination system partially collects and directs said light beam to illuminate a ring field;
   a pattern-carrying mask on a carrier system, wherein said pattern-carrying mask lies in a plane of said ring field;
   a projection device with an entrance pupil that coincides with said exit pupil of said illumination system, wherein said projection objective images an illuminated portion of said pattern-carrying mask in an image field; and
   a light-sensitive substrate on a carrier system, wherein said light-sensitive substrate lies in a plane of said image field.

24. The projection exposure system of claim 23, further comprising a scanning system, wherein said carrier system is moveable in a first direction in said plane of said ring field.

25. The projection exposure system of claim 24,
   wherein said first optical element is one of a plurality of first optical elements,
   wherein said second optical element is one of a plurality of second optical elements,
   wherein said projection exposure system comprises a second carrier system to accommodate said plurality of first optical elements and said plurality of second optical elements,
   wherein said second carrier system is moveable in a second direction, and
   wherein said first direction is perpendicular to said second direction.

26. A method for manufacturing a microelectronic component, comprising using a projection exposure system having:
   an illumination system with:
      a first optical element upon which a light beam from a light source impinges, said first optical element having a first plurality of raster elements that partition said light beam into a plurality of light channels;
      a second optical element that receives said plurality of light channels, said second optical element having a second plurality of raster elements;
      an object plane that receives said plurality of light channels via said second optical element; and
      an exit pupil that is provided with an illumination via said object plane,
      wherein said illumination system is characterized by an assignment of a member of said first plurality of raster elements and a member of said second plurality of raster elements to each of said plurality of light channels to provide a continuous beam path from said first optical element to said object plane for each of said plurality of light channels, and wherein said assignment is changeable to provide an adjustment of said illumination in said exit pupil, wherein said illumination system partially collects and directs said light beam to illuminate a ring field;

a pattern-carrying mask on a carrier system, wherein said pattern-carrying mask lies in a plane of said ring field;

a projection device with an entrance pupil that coincides with said exit pupil of said illumination system, wherein said projection objective images an illuminated portion of said pattern-carrying mask in an image field;

a light-sensitive substrate on a carrier system, wherein said light-sensitive substrate lies in a plane of said image field; and a scanning system, wherein said carrier system is moveable in a first direction in said plane of said ring field.

27. An illumination system for wavelengths $\leq 193$ nm, comprising:

a first optical element upon which a light beam from a light source impinges, said first optical element having a first plurality of raster elements that partition said light beam into a plurality of light channels;

a second optical element that receives said plurality of light channels, said second optical element having a second plurality of raster elements, wherein said illumination system is characterized by an assignment of a member of said first plurality of raster elements and a member of said second plurality of raster elements to each of said plurality of light channels;

wherein said assignment is changeable.

28. The illumination system of claim 27, wherein said second plurality of raster elements is of a quantity such that said changeable assignment yields a plurality of adjustments of said illumination without having to replace said second optical element.

29. The illumination system of claim 28, wherein said first optical element is one of a plurality of first optical elements, and wherein said assignment is changed by replacing said first optical element with another of said plurality of first optical elements.

30. The illumination system of claim 29, further comprising a shifting table on which said plurality of first optical elements is arranged, wherein said replacing is achieved by displacing said shifting table.

31. The illumination system of claim 28, wherein said first plurality of raster elements comprise a plurality of mirror facets on a plate, and wherein said assignment is changed by tilting at least one of said plurality of mirror facets relative to a plane of said plate.

32. The illumination system of claim 27, further comprising a collector unit between said light source and said first optical element.

33. The illumination system of claim 27, further comprising a third optical element in said beam path after said second optical element, wherein said third optical element images a plane in an exit pupil of said illumination system, and wherein said plane is situated in or near said second optical element.

34. The illumination system of claim 27, wherein said plurality of light channels is configured such that illumination in said exit pupil is circular.

35. The illumination system of claim 27, wherein said plurality of light channels is configured such that illumination in said exit pupil is annular-shaped.

36. The illumination system of claim 27, further comprising an exit pupil, wherein said plurality of light channels is configured such that a number of segments of said illumination are separated from each other in said exit pupil.

37. An illumination system for wavelengths $\leq 193$ nm, comprising:

a first optical element upon which a light beam from a light source impinges, said first optical element having a first plurality of raster elements that partition said light beam into a plurality of light channels; and a second optical element that receives said plurality of light channels, said second optical element having a second plurality of raster elements, wherein said illumination system is characterized by an assignment of a member of said first plurality of raster elements and a member of said second plurality of raster elements to each of said plurality of light channels, wherein said assignment is changeable, wherein said second plurality of raster elements is of a quantity M, wherein said first plurality of raster elements is of a quantity N, and wherein M is greater than N.

38. An illumination system for wavelengths $\leq 193$ nm, comprising:

a first optical element upon which a light beam from a light source impinges, said first optical element having a first plurality of raster elements that partition said light beam into a plurality of light channels; and a second optical element that receives said plurality of light channels, said second optical element having a second plurality of raster elements, wherein said illumination system is characterized by an assignment of a member of said first plurality of raster elements and a member of said second plurality of raster elements to each of said plurality of light channels, wherein said assignment is changeable, wherein said first optical element is one of a plurality of first optical elements, and wherein said assignment is changed by replacing said first optical element with another of said plurality of first raster elements.

39. The illumination system of claim 38, wherein said second optical element is one of a plurality of second optical elements, and wherein said assignment is changed by also replacing said second optical element with another of said plurality of second optical elements.

40. The illumination system of claim 38, wherein said second plurality of raster elements comprise a plurality of mirror facets, and wherein said assignment is changed by also changing an orientation and/or position of said plurality of mirror facets.

41. An illumination system for wavelengths $\leq 193$ nm, comprising:

a first optical element upon which a light beam from a light source impinges, said first optical element having a first plurality of raster elements that partition said light beam into a plurality of light channels; and a second optical element that receives said plurality of light channels, said second optical element having a second plurality of raster elements, wherein said illumination system is characterized by an assignment of a member of said first plurality of raster elements and a member of said second plurality of raster elements to each of said plurality of light channels, wherein said assignment is changeable, wherein said first plurality of raster elements has a plurality of mirror facets, and wherein said assignment is changed by changing an orientation of said plurality of mirror facets.

42. The illumination system of claim 41, wherein said second optical element is one of a plurality of second optical elements, and wherein said assignment is changed by also replacing said second optical element with another of said plurality of second optical elements.

43. The illumination system of claim 41, wherein said second plurality of raster elements has a plurality of mirror facets, and wherein said assignment is changed by also changing an orientation and/or position of said plurality of mirror facets.

44. An illumination system for wavelengths ≦193 nm, comprising:

at least a first optical element upon which a light beam from a light source impinges, said first optical element having a first plurality of raster elements, wherein said first optical element is changeable for adjusting a predetermined illumination in an exit pupil of said illumination system.

45. An illumination system for wavelengths ≦193 nm, comprising:

at least a first optical element upon which a light beam from a light source impinges, said first optical element having a first plurality of raster elements, wherein a tilt of said first raster elements on a plate of said first optical element is changed for adjusting a predetermined illumination in an exit pupil of said illumination system.

46. A method for adjusting a distribution of illumination in an exit pupil of an illumination system for wavelengths ≦193 nm, comprising:

using an illumination system having:
a first optical element upon which a light beam from a light source impinges, said first optical element having a first plurality of raster elements that partition said light beam into a plurality of light channels; and a second optical element that receives said plurality of light channels, said second optical element having a second plurality of raster elements, wherein said illumination system is characterized by an assignment of a member of said first plurality of raster elements and a member of said second plurality of raster elements to each of said plurality of light channels, and wherein said assignment is changeable, wherein said exit pupil is characterized by a given light distribution that is adjusted by replacing said first and/or second optical element and/or by changing a prismatic effect and an arrangement of said first and/or second plurality of raster elements, especially by tilting and/or shifting the first and/or second plurality of raster elements, and wherein said assignment is changed to adjust said illumination in said exit pupil.

47. A method for adjusting a distribution of illumination in an exit pupil of an illumination system for wavelengths ≦193 nm comprising:

using an illumination system having at least a first optical element upon which a light beam from a light source impinges, said first optical element having a first plurality of raster elements, wherein said first optical element is changeable for adjusting a predetermined illumination in an exit pupil of said illumination system, wherein said exit pupil is characterized by a given light distribution that is adjusted by replacing said first optical element and/or by changing a prismatic effect and an arrangement of said first plurality of raster elements by tilting and/or shifting the first plurality of raster elements, and wherein said assignment is changed to adjust said illumination in said exit pupil.

48. A projection exposure system for microlithography comprising:

an illumination system having:
a first optical element upon which a light beam from a light source impinges, said first optical element having a first plurality of raster elements that partition said light beam into a plurality of light channels;

a second optical element that receives said plurality of light channels, said second optical element having a second plurality of raster elements, wherein said illumination system is characterized by an assignment of a member of said first plurality of raster elements and a member of said second plurality of raster elements to each of said plurality of light channels, wherein said assignment is changeable, and wherein said illumination system partially collects and directs said light beam to illuminate a ring field;

a projection objective with an entrance pupil that coincides with said exit pupil of said illumination system, wherein said projection objective images an illuminated portion of a pattern-carrying mask in an image field; and a carrier system for holding a light-sensitive substrate in a plane of said image field.

49. The projection exposure system of claim 48, wherein said carrier system is moveable in a first direction in a plane of said ring field.

50. The projection exposure system of claim 49, wherein said first optical element is one of a plurality of first optical elements, wherein said second optical element is one of a plurality of second optical elements, wherein said projection exposure system further comprises a second carrier system to accommodate said plurality of first optical elements and said plurality of second optical elements, wherein said second carrier system is moveable in a second direction, and wherein said first direction is substantially perpendicular to said second direction.

51. A projection exposure system for microlithography comprising:
- an illumination system having
  - at least a first optical element upon which a light beam from a light source impinges, said first optical element having a first plurality of raster elements,
  - wherein said first optical element is changeable for adjusting a predetermined illumination in an exit pupil of said illumination system, and
  - wherein said illumination system partially collects and directs said light beam to illuminate a ring field;
- a projection objective with an entrance pupil that coincides with said exit pupil of said illumination system, wherein said projection objective images an illuminated portion of a pattern-carrying mask in an image field; and
- a carrier system for holding a light-sensitive substrate in a plane of said image field.

52. A method for manufacturing a microelectronic component, comprising using a projection exposure system having
- (a) an illumination system with
  - a first optical element upon which a light beam from a light source impinges, said first optical element having a first plurality of raster elements that partition said light beam into a plurality of light channels;
  - a second optical element that receives said plurality of light channels, said second optical element having a second plurality of raster elements;
  - wherein said illumination system is characterized by an assignment of a member of said first plurality of raster elements and a member of said second plurality of raster elements to each of said plurality of light channels;
  - wherein said assignment is changeable, and
  - wherein said illumination system partially collects and directs said light beam to illuminate a ring field;
- (b) a projection objective with an entrance pupil that coincides with said exit pupil of said illumination system, wherein said projection objective images an illuminated portion of a pattern-carrying mask in an image field; and
- (c) a carrier system moveable in a first direction in a plane of said ring field for holding a light-sensitive substrate in a plane of said image field,
  - wherein said first optical element is one of a plurality of first optical elements,
  - wherein said second optical element is one of a plurality of second optical elements,
- wherein said projection exposure systme has a second carrier system to accommodate said plurality of first optical elements and said plurality of second optical elements,
- wherein said second carrier system is moveable in a second direction, and
- wherein said first direction is substantially perpendicular to said second direction.

* * * * *